US008884492B2

(12) United States Patent
Schroeder

(10) Patent No.: US 8,884,492 B2
(45) Date of Patent: Nov. 11, 2014

(54) CHARGE CORRECTION FOR PIEZOELECTRIC ACTUATOR

(71) Applicant: Agilent Technologies, Inc., Loveland, CO (US)

(72) Inventor: Dale W. Schroeder, Santa Clara, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 13/758,710

(22) Filed: Feb. 4, 2013

(65) Prior Publication Data

US 2013/0200751 A1    Aug. 8, 2013

Related U.S. Application Data

(60) Provisional application No. 61/594,878, filed on Feb. 3, 2012.

(51) Int. Cl.
*H02N 2/06* (2006.01)
*H01L 41/08* (2006.01)
*H01L 41/04* (2006.01)

(52) U.S. Cl.
CPC .............. *H01L 41/042* (2013.01); *H02N 2/062* (2013.01)
USPC ........................ 310/316.01; 310/317; 310/319

(58) Field of Classification Search
USPC .............................. 310/314, 316.01, 317, 319
See application file for complete search history.

(56) References Cited

U.S. PATENT DOCUMENTS

| 4,263,527 | A | 4/1981 | Comstock |
| 6,504,669 | B1 | 1/2003 | Janz et al. |
| 7,352,107 | B2 * | 4/2008 | Micko ...................... 310/316.01 |
| 2004/0113959 | A1 * | 6/2004 | Tamura .............................. 347/9 |
| 2005/0016283 | A1 * | 1/2005 | Micko ............................. 73/649 |
| 2006/0152109 | A1 * | 7/2006 | Micko ........................... 310/319 |
| 2009/0115542 | A1 * | 5/2009 | Nakamura et al. ............ 331/176 |
| 2010/0045244 | A1 | 2/2010 | Fuchs et al. |
| 2011/0068658 | A1 | 3/2011 | Kamitani et al. |
| 2013/0174756 | A1 * | 7/2013 | Rastegar et al. .............. 102/215 |

FOREIGN PATENT DOCUMENTS

DE    102007014326    10/2008

OTHER PUBLICATIONS

"PiezoDrive: Introduction to Charge Drives", info@piezodrive.com.
Search Report mailed Mar. 26, 2014 for German Application No. 102013200353.6.

* cited by examiner

*Primary Examiner* — Derek Rosenau

(57) ABSTRACT

A system comprises a voltage source, a piezoelectric material arranged in a first current path between the voltage source and a first reference voltage, a capacitor arranged in a second current path between the voltage source and a second reference voltage, and a correction circuit configured to adjust the first reference voltage to increase or decrease the current in the first current path according to the current in the second current path.

20 Claims, 5 Drawing Sheets

CHARGE CORRECTION FOR PIEZOELECTRIC ACTUATOR

CROSS-REFERENCE TO RELATED APPLICATIONS

The present application claims priority under 35 U.S.C. §119(e) from U.S. Provisional Patent Application No. 61/594,878 filed on Feb. 3, 2012 and assigned to the present assignee. The entire disclosure of Provisional Patent Application No. 61/594,878 is specifically incorporated herein by reference.

BACKGROUND

Piezoelectric actuators are commonly used to control mechanical displacement of moving components in precision instruments. For example, a piezoelectric actuator may be used in an atomic force microscope (AFM) to control displacement of a cantilever probe as it measures a sample surface. Similarly, a piezoelectric actuator may be used in a hard disk drive (HDD) to control placement of a read/write head as it scans across a disk platter.

A piezoelectric actuator generally comprises a piezoelectric material e.g., a crystal, ceramic, etc.) that provides mechanical displacement in response to an applied electric field. In general, the mechanical displacement is proportional to an amount of electric charge applied to the piezoelectric material. However, due to the difficulty of directly controlling the amount of electric charge applied to the piezoelectric material, the mechanical displacement is typically controlled using a variable voltage source rather than a variable charge source.

FIG. 1 is a circuit diagram illustrating a conventional voltage-based approach to controlling a piezoelectric actuator 100. In FIG. 1, a piezoelectric actuator 100 comprises a high voltage amplifier 105 and a piezoelectric element 110. High voltage amplifier 105 provides an alternating current (AC) mode voltage to piezoelectric element 110, which causes it to expand and contract in a controlled manner. The AC mode voltage typically varies within a range of about 50-150 V, although it is not necessarily restricted to this range.

In general, the applied voltage can be related to the applied electrical charge by the equation $q=Cv$, wherein "q" represents the applied electrical charge, "v" represents the applied voltage, and "C" represents an intrinsic capacitance of the piezoelectric material over a specified range of frequencies. Unfortunately, however, the piezoelectric material does not behave like an ideal capacitor. Consequently, voltage-based control methods may lead to inaccurate control of the piezoelectric actuator.

Two ways that the piezoelectric material differs from an ideal capacitor include its characteristics of creep and hysteresis. Creep refers to a change in displacement over time without any change in the control voltage. For example, the piezoelectric material may initially expand by 95% of a desired increment after receiving the control voltage, and then it may slowly expand, or creep, by another 5% after receiving the control voltage. This creep can be explained by slower charge migration compared with an ideal capacitor. Hysteresis, on the other hand, refers to state dependent behavior of the piezoelectric material. For example, the piezoelectric material's response to changes in the control voltage may vary depending on how much it is currently contracted or expanded.

In light of these and other characteristics of piezoelectric materials, there is a need for improved techniques to control piezoelectric actuators with greater accuracy, stability, and speed.

SUMMARY

In a representative embodiment, a system comprises a voltage source, a piezoelectric material located in a first current path between the voltage source and a first reference voltage, a capacitor located in a second current path between the voltage source and a second reference voltage, and a correction circuit configured to adjust the first reference voltage to increase or decrease a first current in the first current path according to a second current in the second current path.

In another representative embodiment, a method of controlling a piezoelectric actuator comprises generating a control voltage, monitoring a first current in a first current path comprising a piezoelectric material arranged between the control voltage and a first reference voltage, monitoring a second current in a second current path comprising a capacitor arranged between the control voltage and a second reference voltage, and adjusting the first reference voltage to adjust the first current based on the second current.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1:
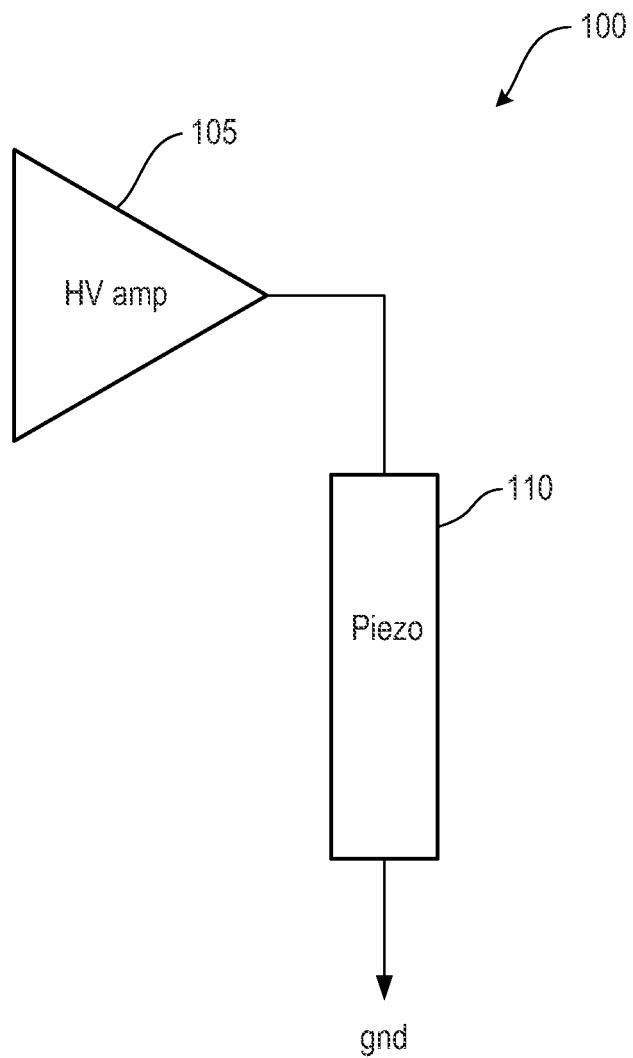
FIG. 1 is a circuit diagram illustrating a conventional voltage-based approach to controlling a piezoelectric actuator.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly indicates otherwise. Thus, for example, 'a device' includes one device and plural devices.

As used in the specification and appended claims, and in addition to their ordinary meanings, the terms 'substantial' or 'substantially' mean to within acceptable limits or degree.

The described embodiments relate generally to piezoelectric actuators and related methods of operation. In certain embodiments, a piezoelectric actuator comprises a correction circuit that adjusts the amount of current flowing through a piezoelectric material according to the amount of current flowing through a reference capacitor. The control circuit adjusts the current so that the piezoelectric actuator behaves more like the capacitor, reducing the effects of non-ideal characteristics such as creep and hysteresis. The adjustment is typically performed by modifying a virtual ground voltage of a current path including the piezoelectric material. For example, the virtual ground voltage can be decreased to increase the current, or it can be increased to decrease the current.

In some embodiments, the piezoelectric actuator has a low frequency mode in which the control circuit connects the current path of the piezoelectric material to the ground voltage at extremely low frequencies. For example, at frequencies below 0.01 Hz, the control circuit may connect the piezoelectric material to the ground voltage without checking the reference capacitor. The frequency range where this occurs can be determined with component selection. Normally, the frequency would be set so low that the piezoelectric actuator has negligible creep. The low frequency mode allows the piezoelectric actuator to operate with greater stability at the lower frequencies. In general, a true charge amplifier is not stable at low frequencies because this would require infinite impedance and no leakage current.

In some embodiments, a piezoelectric actuator comprises a voltage source that provides a control voltage to both a piezoelectric material and a reference capacitor. The piezoelectric material is connected between the voltage source and a virtual ground voltage to form a first current path, and the reference capacitor is connected between the voltage source and a ground voltage to form a second current path. First and second current monitors are connected to the first and second current paths to monitor their respective currents, and a correction circuit compares the respective currents in these paths for the purpose of detecting or determining a difference between them. Based on the detected difference, the correction circuit adjusts the virtual ground voltage so that the first and second current paths have substantially the same current. In other words, the current in the piezoelectric material is adjusted so that the first current approximates the second current in the reference capacitor.

In some embodiments, the reference capacitor is designed with a capacitance that is a fraction of an intrinsic capacitance of the piezoelectric material. For example, it may be 1/n times the intrinsic capacitance. In such embodiments, the correction circuit or a corresponding current monitor may scale or amplify one of the currents based on the fraction before the currents are compared to each other. For example, in some embodiments, the second current monitor amplifies the second current to produce an amplified second current to be provided to the correction circuit. The correction circuit then adjusts a first current after comparing it with the amplified second current.

In some embodiments, the effective capacitance of the piezoelectric material or the reference capacitance can be adjusted by modifying a gain ratio between the first and second current monitors, i.e., a ratio of respective first and second gain values of these current monitors. Such adjustment can be used to change the hysteresis of the piezoelectric actuator. In addition, other parameters of the piezoelectric actuator can also be adjusted, such as the amount of correction applied to the current in the piezoelectric element. In some embodiments, the gain ratio is inversely proportional to a capacitance ratio between the reference capacitor and the piezoelectric material, i.e., a ratio between respective first and second capacitances of these features.

In some embodiments, multiple piezoelectric actuators may be formed with a single high voltage amplifier. In such embodiments, a separate unit of piezoelectric material can be provided for each actuator, and a separate reference capacitor and correction circuit can used in conjunction with each unit of piezoelectric material.

In some embodiments, a correction circuit may be used to adjust current flow through components other than piezoelectric actuators. For example, a correction circuit may be used to correct current in an inductor, a resistor, or a network of capacitors, inductors, and resistors. This can be accomplished by replacing the reference capacitor with a reference inductor or resistor.

These and other embodiments can provide several potential benefits compared with conventional piezoelectric actuators. For instance, by adjusting the current through the piezoelectric material, they can produce more accurate mechanical displacement. Also, because they adjust the level of the virtual ground voltage rather than the voltage source, they can be incorporated in existing system designs without requiring changes to an existing voltage source. Moreover, because the adjustments made by the correction circuit are proportional to the difference between the currents in the first and second current paths, which is typically small, they may be implemented with relatively low voltage components and power supplies. Further, because multiple piezoelectric actuators with the same voltage source can be adjusted independently, these piezoelectric actuators can be designed and implemented with relatively low complexity and compact size. These and other benefits of certain embodiments will become more apparent from specific examples presented below.

Figure 2:
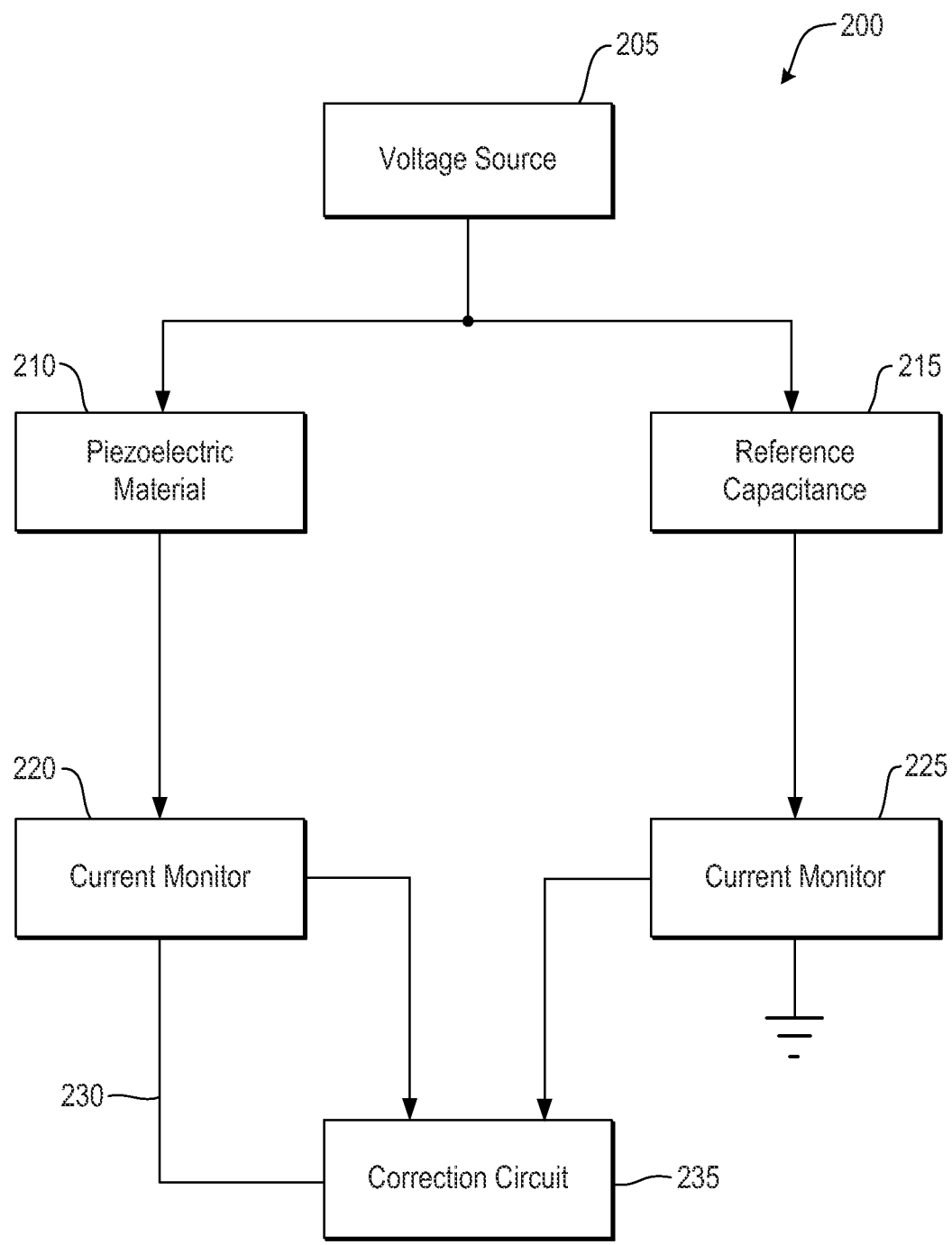
FIG. 2 is a block diagram illustrating a piezoelectric actuator comprising a correction circuit according to a representative embodiment.

FIG. 2 is a block diagram illustrating a piezoelectric actuator 200 comprising a correction circuit according to a representative embodiment. The correction circuit is used to adjust the amount of current passing through a piezoelectric material. This can be used to address the effects of creep and hysteresis on the piezoelectric material.

Referring to FIG. 2, piezoelectric actuator 200 comprises a voltage source 205, a piezoelectric material 210, a reference capacitance 215, first and second current monitors 220 and 225, a variable ground voltage 230, and a correction circuit 235.

Voltage source 205 can comprise, for instance, a high voltage amplifier that outputs an AC control voltage of about 50-150 V to control displacement of piezoelectric material 210. The control voltage is output to both piezoelectric material 210 and reference capacitance 215, and it causes current to flow through both of these features. The current flowing through piezoelectric material 210 will be referred to as a first current, and its path will be referred to as a first current path. Similarly, the current flowing through reference capacitance 215 will be referred to as a second current, and its path will be referred to as a second current path.

The first current causes piezoelectric material 210 to expand or contract as needed to perform its function. For example, the displacement of piezoelectric material 210 can be used to control movement of a cantilever arm of an AFM. The second current acts as a reference current indicating how much current should pass through piezoelectric material 210 based on its intrinsic capacitance.

The first current path passes from voltage source 205, through piezoelectric material 210 and first current monitor 220, and to variable ground voltage 230 (i.e., a first reference voltage). The second current path passes from voltage source 205, through reference capacitance 215 and second current monitor 225, and to ground (i.e., a second reference voltage).

Piezoelectric material 210 typically comprises a piezoelectric material located between top and bottom electrodes. The piezoelectric material expands and contracts proportional to an amount of charge applied to the piezoelectric material. This quantity is controlled by monitoring and adjusting the first current based on the second current.

Reference capacitance 215 typically comprises a discrete capacitor, although it could alternatively be implemented by other devices or materials having suitable capacitance characteristics. To limit power consumption and loading of voltage source 205, the capacitance value of reference capacitance 215 may be set to a fraction of the intrinsic capacitance of piezoelectric material 210. For example, it can be set to $1/100$ the intrinsic capacitance of piezoelectric material 210. Consequently, the second current may be scaled down compared to the first current. The second current may therefore be amplified or scaled up by second current monitor 225, e.g., by 100, for comparison with the first current. Alternatively, the first current may be scaled down by first current monitor 220 for comparison with the second current.

First and second current monitors 220 and 225 detect the respective magnitudes of the currents in the first and second current paths, and they output the detected magnitudes to correction circuit 235. Also, as an alternative to scaling or amplifying the second current, second current monitor 225 may multiply the detected magnitude of the second current by a scaling factor determined by a ratio of the intrinsic capacitance of piezoelectric material 210 and reference capacitance 215, also referred to as a capacitance ratio. For example, where reference capacitance 215 has $1/100$ the capacitance of piezoelectric material, it may multiply the detected magnitude by 100. Alternatively, the second current may be amplified according to the ratio before its magnitude is detected or compared against that of the current in the first current path.

Correction circuit 235 receives signals indicating the respective magnitudes (or scaled magnitude(s)) of the currents in the first and second current paths. It compares these magnitudes and adjusts the value of variable ground voltage 230 so that the current flowing through the first current path is substantially the same as a scaled value of current flowing through the second current path. As an example, if the value of variable ground voltage 230 is initially zero, but the comparison indicates that the current in the first current path needs to be increased, the value of variable ground voltage 230 may be decreased accordingly, e.g., to −5 V to increase the current. This adjustment forces the correct amount of charge into piezoelectric material 210, which can reduce behaviors such as creep and hysteresis.

In some circumstances, it may be beneficial to adjust the amount of correction performed by piezoelectric actuator 200. For example, the behavior of piezoelectric element 310 may differ at different frequencies, requiring different adjustments to be performed. At higher frequencies, for instance, piezoelectric material 210 typically behaves less like a good capacitor than at lower frequencies. Accordingly, at higher frequencies, the gain of correction circuit 235 may be adjusted to a relatively high level to ensure a proportionally larger amount of correction. At low frequencies, on the other hand, piezoelectric material 210 may require less correction, so the gain of correction circuit 235 may be adjusted accordingly. This adjustable gain can be achieved, for instance, under the control of an electronic controller.

It may also be beneficial to adjust the amount of correction based on the stability of correction circuit 235 at certain frequencies. For example, at high frequencies, correction circuit 235 may become unstable at higher gain levels. Accordingly, the amount of correction may be adjusted to address this phenomenon as well.

In some circumstances, it may also be beneficial to adjust the gain ratio between the first and second current paths to make piezoelectric material 210 behave as if it had a different capacitance. This type of adjustment can be referred to as adjusting the target capacitance of piezoelectric material 210. It can be accomplished, for instance, by increasing or decreasing the gain of second current monitor 225, or the gain ratio of first and second current monitors 220 and 225. The optimal target capacitance may be determined, for example, as part of an empirical evaluation of performance or a calibration of a particular instrument. As one example, during calibration of an AFM, different target capacitances may be evaluated to determine which one results in the desired AFM performance.

The above-described adjustments can also be used to change the hysteresis of piezoelectric material 210. In particular, increasing the amount of correction tends to reduce hysteresis, and increasing the target capacitance tends to reduce hysteresis as well. For instance, as the target capacitance is increased, correction circuit 235 adjusts variable ground voltage 230 to draw more current through piezoelectric material 210. This tends to bring the hysteresis curve of piezoelectric material 210 toward a straight line. Moreover, the target capacitance can be adjusted beyond the intrinsic capacitance of piezoelectric material 210 to achieve negative hysteresis values.

As indicated above, the correction circuit gain and the target capacitance can be adjusted in combination to achieve different results. Moreover, these different adjustments can be balanced according to performance tradeoffs between different components of piezoelectric actuator 200. For instance, because correction circuit 235 may become unstable at high gain values under certain circumstances (e.g., at high frequencies), the target capacitance, rather than the gain of correction circuit 235, may be adjusted to reduce hysteresis under those circumstances. By balancing or combining these adjustments, piezoelectric actuator 200 may be able to operate stably even under extreme conditions, such as high feedback and high frequency conditions.

The above adjustments are typically performed under the control of a computer or programmable logic device such as a field programmable gate array (FPGA) or programmable analog to digital converter (ADC). These devices can be controlled, e.g., to adjust the amount of error correction performed by correction circuit 235 or the gain of second current monitor 225.

In certain alternative embodiments, piezoelectric actuator 200 has a low frequency mode in which correction circuit 235 connects the first current path to ground at extremely low frequencies. For example, at frequencies below 0.01 Hz, correction circuit 235 may connect the second current path to ground regardless of the amount of current in the second current path. The frequency range where this occurs can be determined with component selection. For example, correction circuit 235 can be designed with components that connect the first current path to ground at extremely low frequencies. The low frequency mode may allow piezoelectric actuator 200 to operate with greater stability at lower frequencies.

In other alternative embodiments, a structure similar to piezoelectric actuator 200 may be used to regulate current through components other than piezoelectric material 210. For example, in some embodiments, piezoelectric material 210 may be replaced by components such as an inductor, a resistor, or a network of capacitors, inductors, and resistors. The current through these components can be regulated by using a different reference component in place of reference capacitance 215, such as a reference inductor or resistor.

Figure 3:
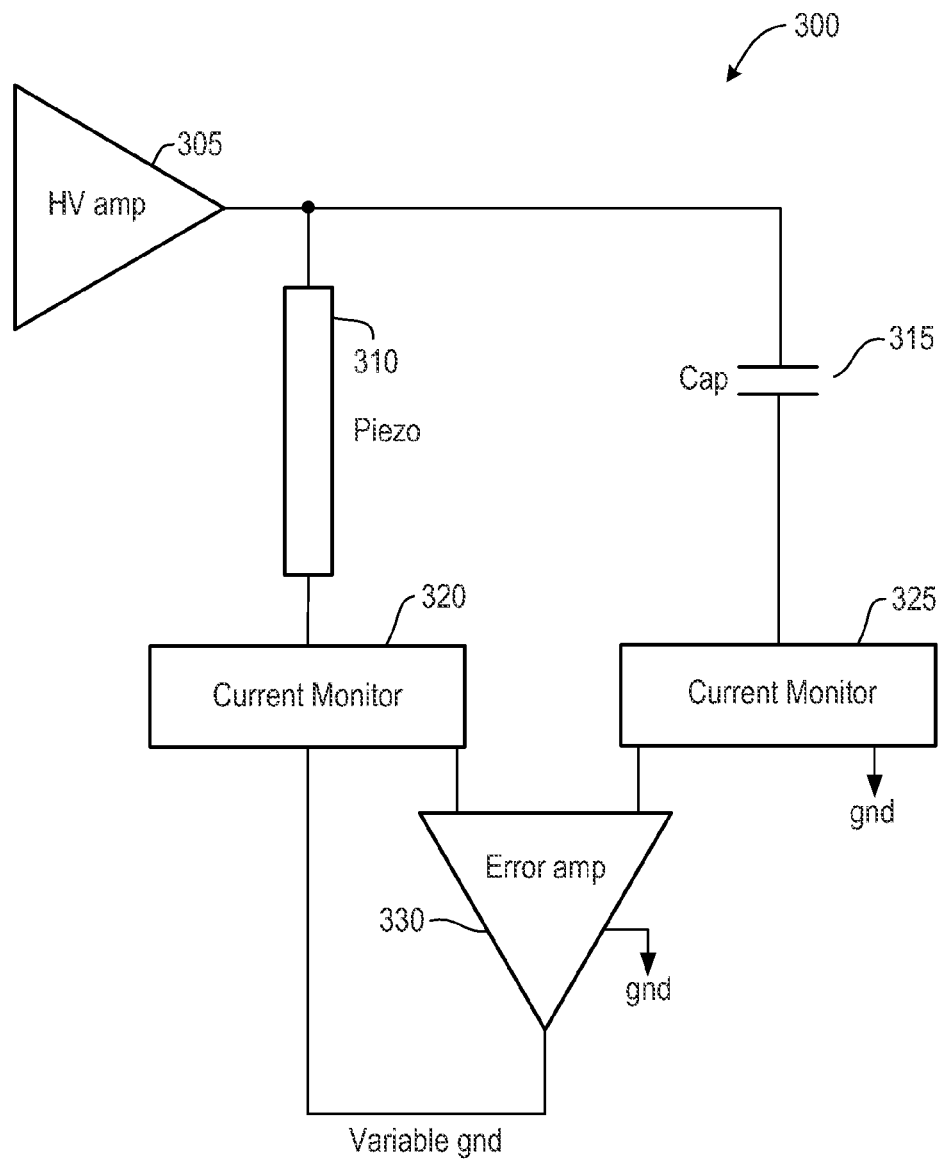
FIG. 3 is a circuit diagram illustrating a piezoelectric actuator comprising a correction circuit according to another representative embodiment.

FIG. 3 is a circuit diagram illustrating a piezoelectric actuator 300 comprising a correction circuit according to another representative embodiment. This embodiment represents a more specific example of piezoelectric actuator 200, and it can be operated or adjusted in ways similar to those described above in relation to FIG. 2.

Referring to FIG. 3, piezoelectric actuator 300 comprises a high voltage (HV) amplifier 305, a piezoelectric element 310, a capacitor 315, first and second current monitors 320 and 325, and an error amplifier 330. Collectively, first and second current monitors 320 and 325 and error amplifier can be referred to as a charge correction amplifier because they are configured to adjust the amount of electrical charge applied to piezoelectric element 310.

HV amplifier 305 generates a high voltage to be applied to piezoelectric element 310 and capacitor 315. First current monitor 320 senses the current through a first current path including piezoelectric element 310, and second current monitor 325 senses the current through a second current path including capacitor 315. The sensed currents are then supplied to error amplifier 330, which adjusts a variable ground voltage of the first current path based on a difference between the sensed currents. The current in the second current path may be scaled down compared to the current in the first current path based on a capacitance ratio between piezoelectric element 310 and capacitor 315. Accordingly, second current monitor 325 may amplify this current or error amplifier 330 may perform the comparison based on a scaled version of the current.

The variable ground voltage is adjusted to change the voltage drop across piezoelectric element 310 such that its current is substantially the same as the scaled version of the current passing through capacitor 315. This adjustment has the effect of making piezoelectric element 310 substantially equivalent to capacitor 315 in terms of its voltage to current conversion characteristics. Viewed yet another way, the dynamic adjustment of the variable ground voltage achieves similar results to a charge driver—i.e., it causes piezoelectric element 310 to function as if it were driven by a charge source rather than a voltage source.

In a typical implementation, error amplifier 330 may be required to adjust the variable ground voltage within a dynamic range as small as +/−5 V or as great as +/−15 V for a 150 V HV amplifier 305, although these numbers are not restrictive. These ranges are relatively small compared to the example 150V output of HV amplifier 305, so error amplifier 330 can be implemented with a relatively small size and a relatively small increase in the power consumption of piezoelectric actuator 300.

Similar to piezoelectric actuator 200, the gain of error amplifier 330 can be adjusted to alter the amount of correction performed on the first current path or to change the hysteresis of piezoelectric element 310. In addition, the gain of second current monitor 325 can be adjusted to change the target capacitance of piezoelectric element 310, which can also be used to reduce hysteresis. As with piezoelectric actuator 200, these adjustments can be performed, for example, under the control of a computer or programmable logic device.

Figure 4:
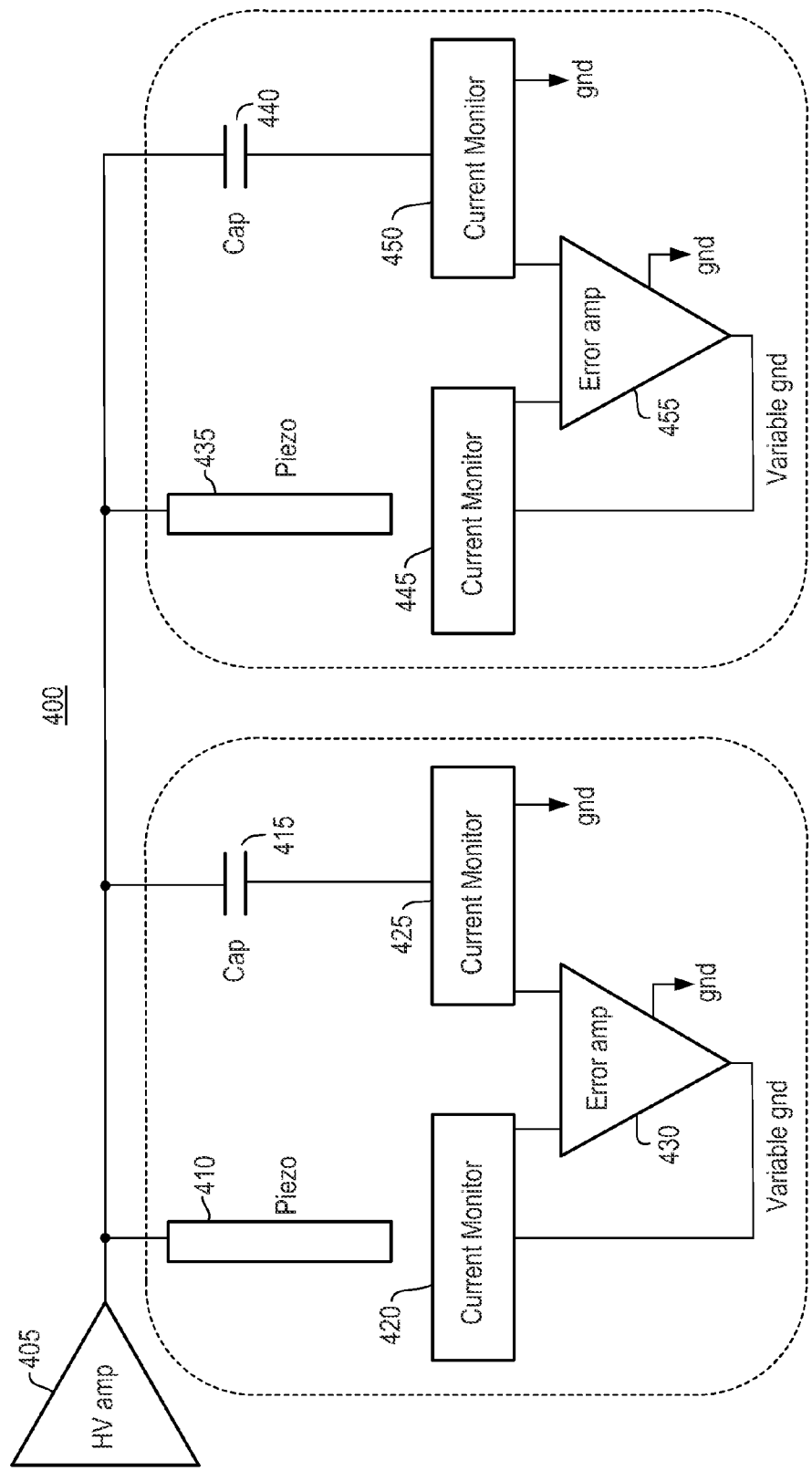
FIG. 4 is a circuit diagram illustrating two piezoelectric actuators using the same voltage source and comprising two separate correction circuits according to a representative embodiment.

FIG. 4 is a circuit diagram illustrating two piezoelectric actuators 400 using the same voltage source and comprising two separate correction circuits according to a representative embodiment.

Referring to FIG. 4, piezoelectric actuators 400 comprise a common HV amplifier 405 and two sub-units indicated by dotted boxes. The first sub-unit comprises a piezoelectric element 410 (or first piezoelectric material), a capacitor 415 (or first capacitor), first and second current monitors 420 and 425, and an error amplifier 430, or first correction circuit. Similarly, the second sub-unit comprises a piezoelectric element 435 (or second piezoelectric material), a capacitor 440 (or second capacitor), first and second current monitors 445 and 450, and an error amplifier 455, or second correction circuit. The example of two sub-units is provided for explanation purposes, but any number of such sub-units could be used in conjunction with a single voltage source such as HV amplifier 405.

HV amplifier 405 supplies a control voltage to each of the first and second sub-units. The first and second sub-units function similar to corresponding components in piezoelectric actuator 300 of FIG. 3. Accordingly, they form a first current path having a first current, a second current path having a second current, a third current path having a third current, and a fourth current path having a fourth current, where the second and fourth current paths are adjusted according to currents in the first and third current paths, respectively. In general, the first current path can be connected to a first reference voltage (e.g., a first virtual ground voltage), the second and fourth current paths can be connected to a second reference voltage (e.g., ground), and the third current path can be connected to a third reference voltage (e.g., a second virtual ground voltage).

The first and second sub-units can be independently controlled and adjusted similar to piezoelectric actuator 300 to achieve different performance objectives, such as different amounts of error correction, hysteresis, and so on. For instance, error amplifiers 430 and 455 can be controlled to independently change the respective currents in piezoelectric elements 410 and 435.

Because piezoelectric actuators 400 are both implemented with the same HV amplifier 405, they may be implemented in a smaller and more power efficient form compared with conventional actuators which may require separate HV amplifiers. In addition, because these sub-units implement charge correction independent of amplifier 405, one or more sub-units can be added to an existing system without altering other components. For instance, piezoelectric actuators 400 could be scaled to include three or more sub-units without requiring changes to the existing components.

Figure 5:
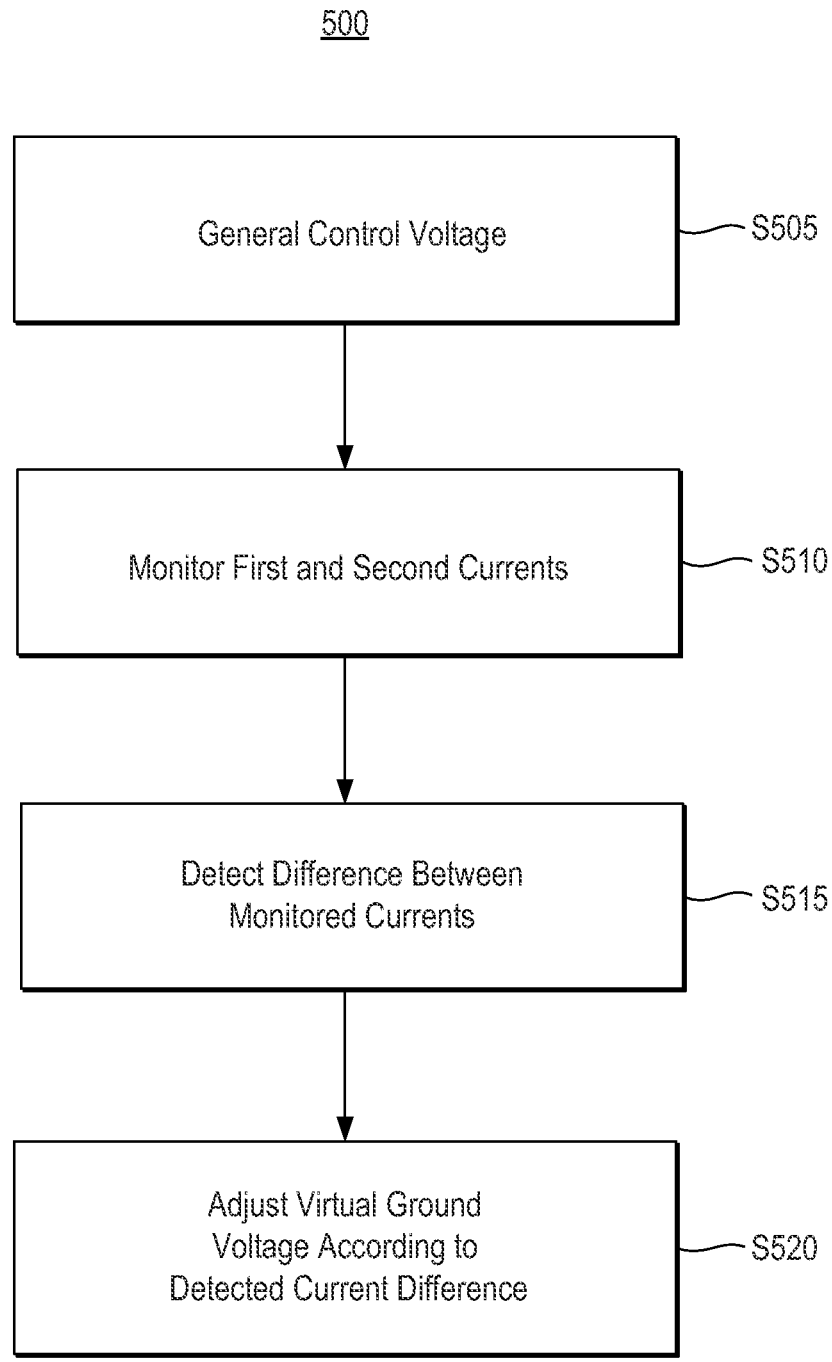
FIG. 5 is a flowchart illustrating a method of operating a piezoelectric actuator comprising a correction circuit according to a representative embodiment.

FIG. 5 is a flowchart illustrating a method of operating a piezoelectric actuator comprising a correction circuit according to a representative embodiment. In the description that follows, example method steps will be indicated by parentheses (SXXX) to distinguish them from example apparatus components.

For explanation purposes, it will be assumed that the method of FIG. 5 is performed by piezoelectric actuator 300 of FIG. 3. Nevertheless, the method is not limited to being performed by a specific device or device configuration. In addition, although the method steps are shown in a sequence, they are not necessarily performed in order. For example, they may be performed simultaneously in a feedback loop configuration such as that illustrated in FIG. 3.

Referring to FIG. 5, the method generates a control voltage to be applied to piezoelectric element 310 and capacitor 315 (S505). This control voltage can be generated by, for instance, HV amplifier 305 or another voltage source. The method also monitors first and second currents that flow through piezoelectric element 310 and capacitor 315, respectively (S510). This monitoring can be accomplished, for instance, by first and second current monitors 320 and 325. The monitoring can also be accompanied by a gain adjustment based on a capacitance ratio between piezoelectric element 310 and capacitor 315. For example, second current monitor 325 can amplify the second current where the capacitance of capacitor 315 is a fraction of the intrinsic capacitance of piezoelectric element 310.

In addition to monitoring the first and second currents, the method also detects a difference between the currents or their scaled equivalents (S515). For example, in some embodiments, error amplifier 330 determines a difference between the currents received from first and second current monitors 320 and 325. Based on the detected differences, the method adjusts a virtual ground voltage of the first current to change the amount of current flowing through piezoelectric element 310 (S520).

In addition to the above adjustments, the method can also adjust an amount of correction applied by error amplifier 330. This can be performed, for instance, by changing the gain of error amplifier 330. In addition, the method can also adjust the target capacitance of piezoelectric element 310 to change its hysteresis or other characteristics. These and other adjustments can be performed under the control of a computer, programmable logic device, or another apparatus.

As indicated by the foregoing, the described embodiments offer several potential benefits compared with conventional piezoelectric actuators. For example, they allow charge correction to be implemented in existing actuator designs with minimal changes to existing components. In addition, they allow charge correction to be implemented with relatively low voltage components and power supplies. Moreover, the charge correction can be implemented in multiple actuators using the same voltage source, providing a relatively small device structure. Moreover, these embodiments allow the target capacitance of a piezoelectric element to be changed electronically by varying the gain ratio of two current paths. Changing the target capacitance also allows the hysteresis of the piezoelectric element to be adjusted from positive to negative or zero.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A system, comprising:
   a voltage source;
   a piezoelectric material located in a first current path between the voltage source and a first reference voltage;
   a capacitor located in a second current path between the voltage source and a second reference voltage; and,
   a correction circuit configured to adjust the first reference voltage to increase or decrease a first current in the first current path according to a second current in the second current path.

2. The system of claim 1, wherein the first reference voltage is a virtual ground voltage and the second reference voltage is ground.

3. The system of claim 1, further comprising:
   a first current monitor located in the first current path and configured to detect a magnitude of the first current; and
   a second current monitor located in the second path and configured to detect a magnitude of the second current.

4. The system of claim 3, wherein the second current monitor amplifies the second current, and the correction circuit adjusts the virtual ground voltage such that the first current approximates the amplified second current.

5. The system of claim 3, further comprising a controller configured to adjust a target capacitance of the piezoelectric material by changing a gain ratio of the first and second current monitors.

6. The system of claim 4, wherein the correction circuit comprises an amplifier that receives the first current and the amplified second current, determines a difference between the first and second currents, and adjusts the virtual ground voltage according to the difference.

7. The system of claim 3, wherein the capacitor and the piezoelectric material have respective first and second capacitances that differ from each other according to a capacitance ratio, and the first and second current monitors have first and second gain values that differ from each other according to a gain ratio inversely proportional to the capacitance ratio.

8. The system of claim 1, wherein the voltage source comprises a high voltage amplifier.

9. The system of claim 1, further comprising:
   a second piezoelectric material arranged in a third current path between the voltage source and a third reference voltage;
   a capacitor arranged in a fourth current path between the voltage source and the second reference voltage; and,
   a second correction circuit configured to adjust the third reference voltage to increase or decrease a third current in the third current path according to a fourth current in the fourth current path.

10. The system of claim 1, wherein the piezoelectric material is configured to provide mechanical displacement of a cantilever probe in an atomic force microscope (AFM).

11. The system of claim 1, wherein the correction circuit has an adjustable gain that can be adjusted to change an amount of correction to be applied to the first current.

12. The system of claim 1, further comprising a computer or programmable logic device configured to control a hysteresis of the piezoelectric material.

13. The system of claim 1, wherein the correction circuit has a low frequency mode in which it connects the piezoelectric material to the second reference voltage.

14. A method of controlling, a piezoelectric actuator, comprising:
   generating a control voltage;
   monitoring a first current in a first current path comprising a piezoelectric material arranged between the control voltage and a first reference voltage;
   monitoring a second current in a second current path comprising a capacitor arranged between the control voltage and a second reference voltage; and
   adjusting the first reference voltage to adjust the first current based on the second current.

15. The method of claim 14, wherein the first reference voltage is a virtual ground voltage and the second reference voltage is ground.

16. The method of claim 15, wherein adjusting the first reference voltage comprises reducing the virtual ground voltage to increase the first current, or increasing the virtual ground voltage to reduce the first current.

17. The method of claim 14, further comprising adjusting a target capacitance of the piezoelectric material by adjusting a gain ratio between a first current monitor that monitors the first current and a second current monitor that monitors the second current.

18. The method of claim 14, wherein adjusting the first reference voltage comprises:
   determining a difference between the first current and the second current; and
   increasing or decreasing the first reference voltage proportional to the difference.

19. The method of claim 18, wherein determining the difference between the first current and the second current comprises amplifying the second current according to a capacitance ratio between the piezoelectric material and the capacitor, and comparing the first current to the amplified second current.

20. The method of claim 19, further comprising:
   monitoring a third current in a third current path comprising a second piezoelectric material arranged between the control voltage and a third reference voltage;
   monitoring a fourth current in a fourth current path comprising a second capacitor arranged between the control voltage and the second reference voltage; and
   adjusting the third reference voltage to adjust the third current based on the fourth current.

* * * * *

UNITED STATES PATENT AND TRADEMARK OFFICE
CERTIFICATE OF CORRECTION

PATENT NO. : 8,884,492 B2  
APPLICATION NO. : 13/758710  
DATED : November 11, 2014  
INVENTOR(S) : Dale W. Schroeder et al.

Page 1 of 1

It is certified that error appears in the above-identified patent and that said Letters Patent is hereby corrected as shown below:

In the Specification

In column 1, line 10, before "Provisional" insert -- U.S. --.

In the Claims

In column 10, line 7, in Claim 3, after "second" insert -- current --.

In column 10, line 52, in Claim 14, delete "controlling," and insert -- controlling --, therefor.

Signed and Sealed this
Second Day of June, 2015

Michelle K. Lee
*Director of the United States Patent and Trademark Office*